(12) United States Patent
Xi et al.

(10) Patent No.: US 11,889,656 B2
(45) Date of Patent: Jan. 30, 2024

(54) ELECTRONIC APPARATUS

(71) Applicant: Lenovo (Beijing) Limited, Beijing (CN)

(72) Inventors: Shenghua Xi, Beijing (CN); Xin Wei, Beijing (CN)

(73) Assignee: Lenovo (Beijing) Limited, Beijing (CN)

( * ) Notice: Subject to any disclaimer, the term of this patent is extended or adjusted under 35 U.S.C. 154(b) by 16 days.

(21) Appl. No.: 17/550,198

(22) Filed: Dec. 14, 2021

(65) Prior Publication Data
US 2022/0312631 A1    Sep. 29, 2022

(30) Foreign Application Priority Data
Mar. 26, 2021    (CN) .......................... 202110328549.3

(51) Int. Cl.
*H05K 7/20* (2006.01)
*H05K 5/03* (2006.01)

(52) U.S. Cl.
CPC .......... *H05K 7/20145* (2013.01); *H05K 5/03* (2013.01); *H05K 7/20172* (2013.01); *H05K 7/20509* (2013.01)

(58) Field of Classification Search
CPC .. H05K 5/03; H05K 7/20172; H05K 7/20509; H05K 7/20145; G06F 1/1635; G06F 1/20
See application file for complete search history.

(56) References Cited

U.S. PATENT DOCUMENTS

| | | | | |
|---|---|---|---|---|
| 5,091,823 A * | 2/1992 | Kanbara | ............ | H05K 7/20927 361/736 |
| 5,424,915 A * | 6/1995 | Katooka | ............ | H05K 7/20909 361/695 |
| 5,689,403 A * | 11/1997 | Robertson, Jr. | ......... | H04B 1/036 415/128 |
| 6,430,042 B1* | 8/2002 | Ohashi | .................. | H01L 23/467 257/E23.099 |
| 7,649,736 B2* | 1/2010 | Hongo | .................... | G06F 1/203 361/679.48 |
| 8,611,088 B2* | 12/2013 | Barna | ................ | H05K 7/20918 165/122 |
| 11,076,501 B2* | 7/2021 | Pedoeem | ........... | H05K 7/20563 |
| 11,516,946 B2* | 11/2022 | Scherler | ............. | H05K 7/20172 |
| 2002/0053451 A1* | 5/2002 | Moden | ................ | H01L 23/4951 174/536 |
| 2009/0244876 A1* | 10/2009 | Li | ........................ | H05K 9/0032 361/818 |

(Continued)

FOREIGN PATENT DOCUMENTS

JP    2006019384 A    1/2006

*Primary Examiner* — Michael A Matey
(74) *Attorney, Agent, or Firm* — ANOVA LAW GROUP, PLLC

(57) ABSTRACT

An electronic apparatus includes a body including a containing cavity, a separation component arranged at the containing cavity to divide the containing cavity into a first cavity and a second cavity, a heat generation assembly arranged at the first cavity, and an air guide component arrange at the second cavity to drive airflow at the second cavity to dissipate the heat of the heat generation assembly through the separation component, wherein the second cavity is configured as an air duct of the electronic apparatus.

12 Claims, 2 Drawing Sheets

(56) References Cited

U.S. PATENT DOCUMENTS

| | | | | |
|---|---|---|---|---|
| 2009/0310301 A1* | 12/2009 | Nelson | ............... | H05K 7/20163 361/695 |
| 2009/0323275 A1* | 12/2009 | Rehmann | .............. | G06F 1/1632 361/679.48 |
| 2010/0079940 A1* | 4/2010 | Mongia | ..................... | G06F 1/20 361/679.49 |
| 2011/0222237 A1* | 9/2011 | Fujiwara | ................. | G06F 1/203 361/679.48 |
| 2014/0235156 A1* | 8/2014 | Li | ...................... | H05K 7/20154 454/184 |
| 2015/0017905 A1* | 1/2015 | Li | ..................... | H05K 7/20163 454/184 |
| 2015/0062805 A1* | 3/2015 | Katsumata | ................ | G06F 1/20 361/679.49 |
| 2015/0355693 A1* | 12/2015 | Chang | .................. | H05K 5/0086 361/679.48 |
| 2017/0354060 A1* | 12/2017 | Pedoeem | ............ | H05K 7/20145 |
| 2019/0219677 A1* | 7/2019 | Gupta | ................. | A61B 8/4461 |
| 2019/0320555 A1* | 10/2019 | Flavin | ................. | H05K 7/20409 |
| 2022/0272865 A1* | 8/2022 | Chien | ................. | H05K 7/20409 |
| 2022/0312633 A1* | 9/2022 | Zhang | ................ | H05K 7/20154 |

\* cited by examiner

ELECTRONIC APPARATUS

CROSS-REFERENCE TO RELATED APPLICATION

This application claims priority to Chinese Patent Application No. 202110328549.3, filed on Mar. 26, 2021, the entire content of which is incorporated herein by reference.

TECHNICAL FIELD

The present disclosure generally relates to an electronic apparatus.

BACKGROUND

Electronic apparatuses are apparatuses that people often use. However, the current heat dissipation mode of electronic apparatus is single, and the adaptability of electronic apparatus is poor.

SUMMARY

Embodiments of the present disclosure provide an electronic apparatus. The electronic apparatus includes a body including a containing cavity, a separation component arranged at the containing cavity to divide the containing cavity into a first cavity and a second cavity, a heat generation assembly arranged at the first cavity, and an air guide component arrange at the second cavity to drive airflow at the second cavity to dissipate heat of the heat generation assembly through the separation component, wherein the second cavity is configured as an air duct of the electronic apparatus.

DESCRIPTION OF REFERENCE NUMERALS

Figure 1:
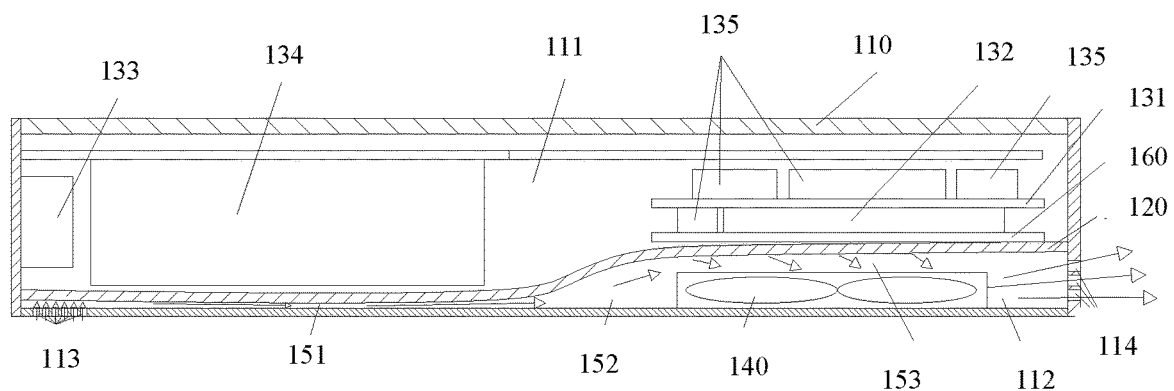
FIG. 1 illustrates a schematic structural diagram of an electronic apparatus according to some embodiments of the present disclosure.

101, first opening; 102, second opening; 103, third opening; 104, fourth opening; 105, fifth opening; 110, body; 111, first cavity; 112, second cavity; 113, inlet; 114, outlet; 115, first middle frame; 116, first cover; 117, second cover; 118, second middle frame; 119, third middle frame; 120, separation component; 121, support component; 122, heat exchange component; 131, main board; 132, main heat generation component; 133, audio assembly; 134, battery; 135, auxiliary heat generation component; 140, air guide component; 151, first air duct; 152, second air duct; 153, third air duct; 160, thermal conductive component.

DETAILED DESCRIPTION OF THE EMBODIMENTS

Technical features of various embodiments described in the present disclosure may be implemented in any combinations without contradiction. For example, different technical features may be combined to form different implementation manners to avoid unnecessary repetition, various possible combinations of technical features of the present disclosure are not repeated here.

In the description of embodiments of the present disclosure, unless otherwise specific and limited, the term "connect" should be understood in a broad sense. For example, the connection may include an electrical connection or a connection inside two elements. The connection may be direct connections or indirect connections through media. For those of ordinary skill in the art, the specific meaning of the above terms may be understood according to a specific situation.

The terms "first/second/third" used in embodiments of the present disclosure only distinguish similar objects and do not represent a specific order for the objects. In some embodiments, "first\second\third" may be interchanged in specific order or precedence when permitted. Objects distinguished by "first\second\third" may be interchanged under appropriate circumstances, so that the embodiments of the present disclosure described herein may be implemented in other sequences.

An electronic apparatus provided by embodiments of the present disclosure is described in detail below accompany by drawings FIG. 1 to FIG. 4. The electronic apparatus includes a body 110, a separation component 120, a heat generation assembly, and an air guide component 140. The separation component 120 is arranged at a containing cavity. The separation component 120 is configured to separate the containing cavity to a first cavity 111 and a second cavity 112. The heat generation assembly is arranged at the first cavity 111. The air guide component 140 is arranged at the second cavity 112, and the air guide component may be configured to drive air to flow in the second cavity 112. The air guide component 140 dissipates heat for the heat generation assembly through the separation component 120. The second cavity is a duct of the electronic apparatus, which is facilitated to dissipate the heat for the heat generation assembly of the electronic apparatus through the second cavity 112. At the same time, since the heat generation assembly and the air guide component 140 are located at different cavities, the operation of the heat generation component and the heat dissipation of the air guide component 140 may not be affected by each other.

In some embodiments of the present disclosure, a structure of the electronic apparatus is not limited. For example, the electronic apparatus may be a computer or a mobile phone.

In some embodiments of the present disclosure, a structure of the body is not limited. For example, the body 110 may be a rectangular parallelepiped structure. As an implementation, the body 110 may be a body 110 of the mobile phone.

A shape of the containing cavity is not limited. For example, the containing cavity may be a rectangular parallelepiped.

Figure 2:
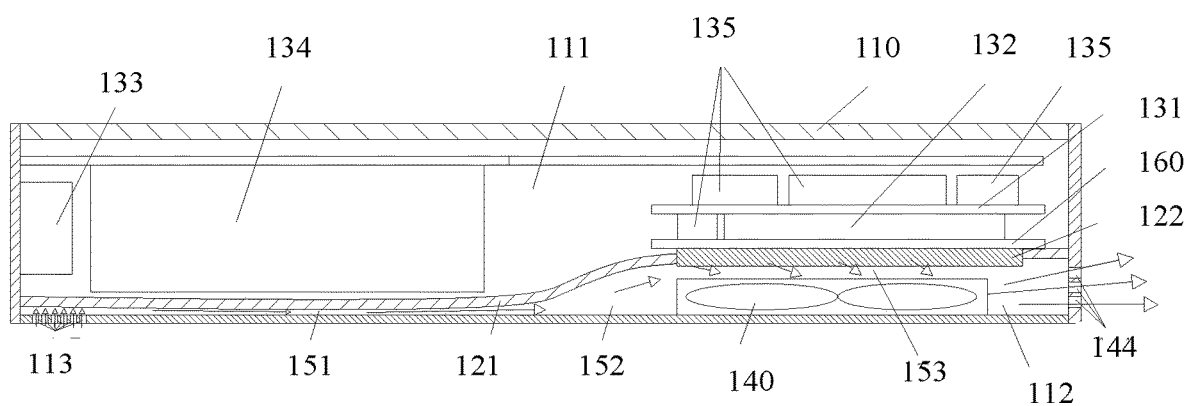
FIG. 2 illustrates a schematic structural diagram of the electronic apparatus according to some embodiments of the present disclosure.

In some embodiments of the present disclosure, a structure of the separation component 120 is not limited. The separation component 120 can include a separation plate. For example, the separation plate may be a flat plate structure. As another example, the separation plate may include a variable plate structure. As shown in FIG. 1 and FIG. 2, the separation plate includes two flat plate components and one bent plate component. The two flat plate components are connected by the bent plate component.

The shapes of the first cavity 111 and the second cavity 112 are not limited, as long as the first cavity can accommodate the heat generation assembly, and the second cavity 112 can accommodate the air guide component 140. In some embodiments, the first cavity 111 is a sealed cavity, so as to ensure that the first cavity 111 is waterproof and dustproof.

Material of the separation plate is not limited, as long as the separation plate has thermal conductivity. For example, the separation plate may be a copper plate or an aluminum plate.

In some embodiments, as shown In FIG. 2, the separation component 120 includes a support component 121 and a heat exchange component 122. The support component 121 is connected to an inner wall of the containing cavity, and the support component 121 includes a through-hole. The heat exchange component 122 is arranged at the through-hole, and part of the heat exchange component 122 is located in the second cavity 112. The heat exchange component 122 is thermally connected to the heat generation assembly, so that the heat generated by the heat generation assembly is conducted to the heat exchange component 122 partially located in the second cavity 112, thereby improving the heat dissipation capability of the electronic apparatus.

A form of thermal connection is not limited, as long as the connection can conduct heat. For example, the thermal connection may be direct contact, may be a connection through a thermal conductive component 160, or may be a connection through a thermal conductive glue. The thermal conductive component 160 may be a block-shaped structure or a plate-shaped structure. The material of the thermal conductive component 160 may be copper or aluminum.

The heat exchange component 122 may protrude from a surface of the support component 121 at the second cavity 112 side, so as to increase the volume of the heat exchange component 122 at the second cavity 112 and improve the heat dissipation capability of the electronic apparatus.

The heat exchange component 122 may also satisfy a coplanar condition with a surface of the support component 121 on a side facing the second cavity 112. The coplanar condition refers to being coplanar or approximately coplanar.

The heat exchange component 122 and the air guide component 140 may be arranged overlappingly in a first direction, so as to reduce the distance between the heat exchange component 122 and the air guide component 140 and improve the ability of the air guide component 140 to dissipate the heat from the heat exchange component 122.

The first direction is not limited. For example, the first direction may be a thickness direction of the electronic apparatus.

The shape of the heat exchange component 122 is not limited. For example, the shape of the heat exchange component 122 may match the shape of the air guide component 140, so as to increase the dissipate the heat area of the heat exchange component 122 and improve the heat dissipation capability of the electronic apparatus.

The structures of the support component 121 and the heat exchange component 122 are not limited. For example, the support component 122 has a plate structure, and the heat exchange component 122 is a heat exchanger, so as to improve the heat conduction capability of the heat exchange component 122. In some embodiments, to ensure that the first cavity 111 is the sealed cavity, the plate structure of the heat exchanger is arranged at the through-hole, and a flow channel structure of the heat exchanger is located at a side facing the second cavity 112. The direction of the flow channel structure of the exchanger may match the direction in which the air guide component 140 drives air to flow in the second cavity 112, so as to improve the heat exchange capability of the heat exchanger. The flow channel structure is connected to the plate structure. For example, as shown in FIG. 1, the first cavity and the second cavity are overlapped, and the second cavity and the first cavity may be in a completely covering relationship. That is, the maximum cross-section of the second cavity is the same or approximately the same as the back of the electronic apparatus.

In some embodiments of the present disclosure, the structure of the heat generation assembly is not limited, as long as the air guide component 140 may dissipate the heat for the heat generation assembly.

A position of the heat generation assembly is not limited. For example, at least a portion of the heat generation assembly overlaps the air guide component 140 in the first direction, so as to reduce the distance between the at least portion of the heat generation assembly and the air guide component 140 and improve the ability of the air guide component 140 to dissipate the heat from the heat generation assembly.

For example, as shown in FIG. 1, the heat generation assembly includes a main board 131 and a main heat generation component 132. At least a portion of the main board 131 overlaps the air guide component 140 in the first direction. The main heat generation component 132 is arranged at the main board 131 close to the air guide component 140, and the main heat generation component 132 and the air guide component 140 overlapping in the first direction. The distance between the main heat generation component 132 and the air guide component 140 is reduced by arranging the main heat generation component 132 on the side of the main board 131 close to the air guide component 140, such that the ability of the air guide component 140 to dissipate the heat from the main heat generation component 132 is improved. The overlapping arrangement of the main heat generation component 132 and the air guide component 140 in the first direction increases the area of the close area between the main heat generation component 132 and the air guide component 140, thereby increasing the ability of air guide component 140 to dissipate the heat of the main heat generation component 132.

The main board 131 at least partially overlaps with the air guide component 140 in the first direction, which can increase the area of the main board 131 and the close area of the air guide component 140, thereby improving the ability of the air guide component 140 to dissipate the heat from the main board 131.

As shown in FIG. 1, the main board 131 further includes one or more auxiliary heat generation components 135. The one or more auxiliary heat generation components 135 are arranged at the main board 131 close to the air guide component 140. One or more auxiliary heat generation components 135 may also be arranged at the main board 131 far away from the air guide component 140. The air guide component 140 can dissipate heat for the auxiliary heat generation component of the main board 131 through the air guide component 140.

The structure of the main heat generation component 132 is not limited. For example, the main heat generation component 132 may include a processor or a graphic card.

The structure of the auxiliary heat generation component 135 is not limited. For example, the auxiliary heat generation component 135 may include electronic elements of the main board 131.

The first direction is not limited. For example, the first direction may be the thickness direction of the electronic apparatus.

The electronic apparatus further includes a thermal conductive component 160. The thermal conductive component 160 is arranged at the first cavity 111. The thermal conductive component 160 contacts the main heat generation component 132, and the thermal conductive component 160 is thermally connected to the separation component 120. The thermal conductive component 160 is configured to conduct the heat generated by the main heat generation component 132 to the separation component 120.

The thermal conductive component 160 and the thermal connection have been described above and will not be repeated here.

As another example, as shown in FIG. 1 and FIG. 2, the heat generation assembly includes an audio assembly 133 and a battery 134, so as to dissipate the heat of the audio assembly 133 and the battery 134 through the second cavity 112 and the air guide component 140.

The position of the audio assembly 133 and the battery 134 is not limited. For example, as shown in FIG. 1 and FIG. 2, the audio assembly 133 and the battery 134 are staggered from the air guide component 140 in the first direction.

The audio assembly 133 and the battery 134 may be thermally connected to the separation component 120, so as to improve the ability of the air guide component 140 to dissipate the heat from the audio assembly 133 and the battery 134.

The audio assembly 133 may include an audio play assembly. In some embodiments, the audio assembly 133 may include a speaker.

In some embodiments of the present disclosure, the structure of the air guide component 140 is not limited, as long as the air guide component 140 can drive the airflow at the second cavity 112, so as to dissipate the heat for the heat generation assembly through the separation component 120. For example, the air guide component 140 may be an axial-flow structure or a centrifugal structure.

In some embodiments of the present disclosure, the air guide component 140 may be a fan. A gap exists between the fan and the separation component 120. The fan takes air in from a first side, and the fan takes the air out at a second side, where the first side and the second side are arranged adjacent to each other.

In some embodiments, the fan may be the centrifugal structure.

In some embodiments, a position of the first side is not limited. For example, the first side may be at a top. As another example, the first side may face the separation component 120, so that cooler air may come into contact the separation component 120 before being sucked in from the first side, which improves the heat dissipation capability of the fan.

In some embodiments, as shown in FIG. 1 and FIG. 2, the body 110 includes an inlet 113 and an outlet 114. The air duct includes a first air duct 151, a second air duct 152, and a third air duct 153. The first air duct 151 is close to the inlet 113 side, and the second air duct 152 is close to the air inlet side of the fan. The third air duct 153 is connected to the first air duct 151 and the second air duct 152, so that the fan may drive the air to enter the air inlet of the fan through the first air duct 151, the third air duct 153, and the second air duct 152 in sequence.

The position of the inlet 113 is not limited. For example, as shown in FIG. 1 and FIG. 2, the inlet 113 is arranged at a bottom of the body 110. The inlet 113 is located at the bottom of the first air duct 151. The inlet 113 may also be arranged at a side of the body 110. The inlet 113 may locate at the side of the first air duct 151.

The position of the outlet 114 is not limited. For example, as shown in FIG. 1 and FIG. 2, the outlet 114 is arranged at the side of the body 110. The outlet 114 is arranged at the side of body 110 corresponding to the third air duct 153.

In some embodiments, arrows in FIG. 1 and FIG. 2 represent the flow direction of the air.

The first air duct 151 has a first width in the first direction. The second air duct 152 has a second width in the first direction. The third air duct 152 has a third width in the first direction.

Values of the first width, the second width, and the third width are not limited. For example, the second width value and the first width value are both less than the third width value, so that the air flows in an air duct with narrow sides on both sides and wide in the middle to increase the wind power of the fan.

Since the first air duct 151 is a cavity, the first air duct 151 may be set thinner. In some embodiments, the value of the first width ranges from 0.05 mm to 0.1 mm.

When the heat generation assembly includes the audio assembly 133 and the battery 134, the space where the audio assembly 133 and the battery 134 are arranged in the first cavity 111 may overlap with the first air duct 151 in the first direction.

In some embodiments of the present disclosure, projections of the first cavity 111 and the second cavity 112 overlap in the first direction, so that the first cavity 111 and the second cavity 112 form a laminated structure in the first direction, therefore, the heat dissipation capability of the electronic apparatus may be improved via the second cavity 112 with a larger area.

The implementation manner for overlapping the projection of the first cavity 111 and the second cavity 112 in the first direction is not limited.

Figure 3:
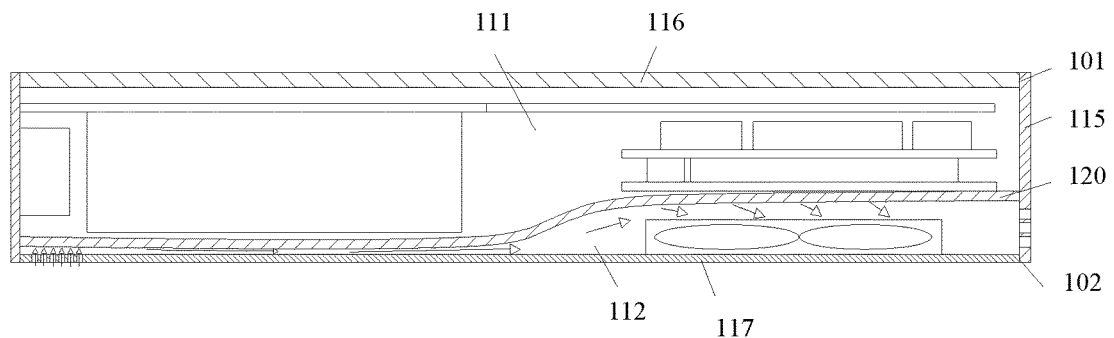
FIG. 3 illustrate a schematic structural diagram of the electronic apparatus according to some embodiments of the present disclosure.

In some embodiments, as shown in FIG. 3, the body 110 includes a first middle frame 115. The first middle frame 115 includes the containing cavity. The first middle frame 115 includes a first opening 101 communicating with the first cavity 111 and a second opening 102 communicating with the second cavity 112, where the first opening 101 and the second opening 102 are oppositely arranged. The separation component 120 is connected to the first middle frame 115, so that the accommodating cavity of the first middle frame 115 may be divided into a first cavity 111 and a second cavity 112 by the separation component 120.

In some embodiments, the position of the first opening 101 and the second opening 102 is not limited. For example, the first opening 101 may be arranged at the top of the first middle frame 115, and the second opening 102 may be arranged at the bottom of the first middle frame 115.

In some embodiments, the body 110 may further include a first cover 116 and a second cover 117. The first cover 116 is configured to cover the first opening 101.

The first cover 116 may be arranged at the top of the first middle frame 115, and the first cover 116 matches the shape of the first middle frame in the first direction.

The structure of the first cover 116 is not limited. For example, the first cover 116 may include a display screen.

The second cover 117 may be arranged at the bottom of the first middle frame 115, and the first cover 117 matches the shape of the first middle frame in the first direction.

Figure 4:
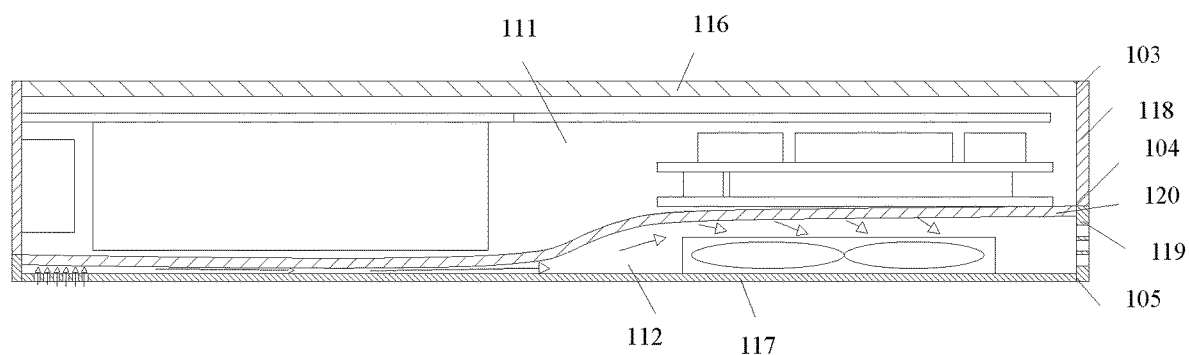
FIG. 4 illustrates a schematic structural diagram of the electronic apparatus according to some embodiments of the present disclosure.

In some embodiments, as shown in FIG. 4, the body 110 includes a second middle frame 118 and a third middle frame 119. The second middle frame 118 includes the first cavity 111, and the second middle frame includes a third opening 103 and a fourth opening 104. The third opening 103 and the fourth opening 104 are arranged opposite. The third middle frame 119 includes the second cavity 112 and a fifth opening 105. The third middle frame 119 is connected to the second middle frame 118, and the third middle frame 119 overlaps the projection of the second middle frame 118 in the first direction. The separation component 120 and the fifth opening 105 are arranged opposite. The separation component 120 is configured to cover the fourth opening 104, such that the first cavity 111 and the second cavity 112 may be arranged at two overlapping middle frames.

In some embodiments, the position of the third opening 103 and the fourth opening 104 is not limited. For example, the third opening 103 is arranged at a top of the second middle frame 118, and the fourth opening 104 is arranged at a bottom of the second middle frame 118.

In some embodiments, the position of the fifth opening 105 and the separation component 120 is not limited. For example, the separation component 120 is arranged at the top of the middle frame 119, and the fifth opening 105 is arranged at the bottom of the third middle frame 119.

The second middle frame 118 overlaps the top of the third middle frame 119. The third opening 103 is arranged at the top, the fourth opening 104 and the separation component 120 is arranged at the middle, and the fifth opening 105 is arranged at the bottom.

In some embodiments. the body 110 may further include the first cover 116 and the second cover 117. The first cover 116 is configured to cover the third opening 103.

The first cover 116 is arranged at the top of the second middle frame 118. The first cover 116 matches the shape of the second middle frame 118 in the first direction.

The second cover 117 is arranged at the bottom of the third middle frame 119. The second cover 117 matches the shape of the third middle frame 119 in the first direction.

The electronic apparatus provided by embodiments of the present disclosure includes the body 110. The body 110 includes the containing cavity. The electronic apparatus also includes the separation component 120 arranged at the containing cavity, such that the containing cavity may be divided into the first cavity 111 and the second cavity 112 by the separation component. The electronic apparatus further includes a heat generation assembly. The heat generation assembly is arranged at the first cavity 111. The electronic apparatus still further includes the air guide component 140 arranged in the second cavity 112. The air guide component 140 is configured to drive the airflow in the second cavity 112, so as to dissipate the heat for the heat generation assembly through the separation component 120. The second cavity 112 is configured as the air duct for the electronic apparatus, so as to dissipate the heat for the heat generation assembly of the electronic apparatus through the second cavity 112. Since the heat generation assembly and the air guide component 140 are arranged at different cavities, the operation of the heat generation component and the heat dissipation of the air guide component 140 do not affect each other.

The above embodiments are merely exemplary embodiments of the present disclosure and are not used to limit the present disclosure. Those of skill in the art may make various modifications and equivalent replacements to the present disclosure within the essence and scope of the present disclosure. These modifications and equivalent replacements should be within the scope of the present disclosure. Therefore, the scope of the invention should be subject to the scope of the claims.

What is claimed is:

1. An electronic apparatus comprising:
a body with a containing cavity;
a separation component arranged at the containing cavity and dividing the containing cavity into a first cavity and a second cavity;
a heat generation assembly arranged at the first cavity; and
a fan arranged at the second cavity and configured to drive airflow at the second cavity to dissipate heat of the heat generation assembly through the separation component, at least a portion of the heat generation assembly overlapping with the fan in a first direction, the first direction being from the first cavity to the second cavity, and the second cavity being an air duct of the electronic apparatus;
wherein the separation component includes:
a support component connected to an inner wall of the containing cavity and having a through-hole; and
a heat exchange component arranged at the through-hole and thermally connected to the heat generation assembly, the fan at the second cavity overlapping with the heat exchange component in the first direction.

2. The electronic apparatus of claim 1, wherein:
the fan is arranged at a distance from the separation component, a top side of the fan facing the separation component being an air inlet side of the fan.

3. The electronic apparatus of claim 2, wherein:
the body includes an inlet and an outlet; and
the second cavity includes:
a first air duct close to the inlet of the body and having a first width in the first direction;
a second air duct close to the air inlet side of the fan and having a second width in the first direction; and
a third air duct in communication with the first air duct and the second air duct, and having a third width in the first direction, the third width being larger than the first width and the second width.

4. The electronic apparatus of claim 1, further comprising:
a thermal conductive component arranged at the first cavity;
wherein:
the heat generation assembly includes:
a main board at least partially overlapping the fan in the first direction; and
a main heat generation component arranged at a side of the main board close to the fan and overlapping the fan in the first direction; and
the thermal conductive component contacts the main heat generation component and is thermally connected to the separation component, and is configured to conduct heat generated by the main heat generation component to the separation component.

5. The electronic apparatus of claim 1, wherein the first cavity includes a sealed cavity.

6. The electronic apparatus of claim 1, wherein
the heat exchange component protrudes from a surface of the support component facing the second cavity, and matches a shape of the fan.

7. The electronic apparatus of claim 1, wherein the heat exchange component includes:
a plate structure arranged at the through-hole; and
a flow channel structure connected to the plate structure and arranged at a side facing the second cavity, a direction of the flow channel structure matching a direction in which the fan drives air to flow in the second cavity.

8. The electronic apparatus of claim 1, wherein a projection of the first cavity in the first direction overlaps a projection of the second cavity in the first direction.

9. The electronic apparatus of claim 8, wherein the body includes a middle frame connected to the separation component and including:
   the containing cavity;
   a first opening connected to the first cavity;
   a second opening connected to the second cavity arranged opposite to the first opening.

10. The electronic apparatus of claim 9, wherein the body further includes:
   a first cover covering the first opening and arranged at a top of the middle frame, and matching a shape of the middle frame in the first direction; and
   a second cover covering the second opening and arranged at a bottom of the middle frame, and matching the shape of the first middle frame in the first direction.

11. The electronic apparatus of claim 8, wherein the body includes:
   a first middle frame including:
      the first cavity;
      a first opening; and
      a second opening arranged opposite to the first opening and covered by the separation component; and
   a second middle frame having the second cavity and a third opening arranged opposite to the separation component, the second middle frame being connected to the first middle frame, and a projection of the second middle frame in the first direction overlapping a projection of the first middle frame in the first direction.

12. The electronic apparatus of claim 11, wherein the body further includes:
   a first cover covering the third opening and arranged at a top of the second middle frame, and matching a shape of the second middle frame in the first direction; and
   a second cover covering the fifth opening and arranged at a bottom of the third middle frame, and matching the shape of the third middle frame in the first direction.

* * * * *